United States Patent
Cheng et al.

(10) Patent No.: US 10,692,250 B2
(45) Date of Patent: Jun. 23, 2020

(54) GENERALIZED MULTI-CHANNEL MRI RECONSTRUCTION USING DEEP NEURAL NETWORKS

(71) Applicant: The Board of Trustees of the Leland Stanford Junior University, Stanford, CA (US)

(72) Inventors: Joseph Yitan Cheng, Los Altos, CA (US); Morteza Mardani Korani, Palo Alto, CA (US); John M. Pauly, Stanford, CA (US); Shreyas S. Vasanawala, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/260,921

(22) Filed: Jan. 29, 2019

(65) Prior Publication Data

US 2019/0236817 A1    Aug. 1, 2019

Related U.S. Application Data

(60) Provisional application No. 62/623,973, filed on Jan. 30, 2018.

(51) Int. Cl.
*G06T 11/00*    (2006.01)
*G01R 33/56*    (2006.01)
(Continued)

(52) U.S. Cl.
CPC ........ *G06T 11/005* (2013.01); *G01R 33/4826* (2013.01); *G01R 33/5608* (2013.01);
(Continued)

(58) Field of Classification Search
CPC ............ G01R 33/4824; G01R 33/4826; G01R 33/5608; G01R 33/5611; G06N 3/04; G06N 3/0454; G06N 3/08; G06T 11/005
See application file for complete search history.

(56) References Cited

U.S. PATENT DOCUMENTS

6,841,998 B1    1/2005  Griswold
8,379,951 B2    2/2013  Lustig
(Continued)

*Primary Examiner* — Rishi R Patel
(74) *Attorney, Agent, or Firm* — Lumen Patent Firm (57) ABSTRACT

A method for magnetic resonance imaging acquires multi-channel subsampled k-space data using multiple receiver coils; performs singular-value-decomposition on the multi-channel subsampled k-space data to produce compressed multi-channel k-space data which normalizes the multi-channel subsampled k-space data; applies a first center block of the compressed multi-channel k-space data as input to a first convolutional neural network to produce a first estimated k-space center block that includes estimates of k-space data missing from the first center block; generates an n-th estimated k-space block by repeatedly applying an (n−1)-th estimated k-space center block combined with an n-th center block of the compressed multi-channel k-space data as input to an n-th convolutional neural network to produce an n-th estimated k-space center block that includes estimates of k-space data missing from the n-th center block; reconstructs image-space data from the n-th estimated k-space block.

6 Claims, 5 Drawing Sheets

(51) Int. Cl.
  *G01R 33/48* (2006.01)
  *G01R 33/561* (2006.01)
  *G06N 3/08* (2006.01)
  *G06N 3/04* (2006.01)

(52) U.S. Cl.
  CPC ...... *G01R 33/5611* (2013.01); *G01R 33/4824* (2013.01); *G06N 3/04* (2013.01); *G06N 3/08* (2013.01)

(56) References Cited

U.S. PATENT DOCUMENTS

| | | |
|---|---|---|
| 9,396,561 B2 | 7/2016 | Dumoulin |
| 2013/0088225 A1 | 4/2013 | Weller |
| 2019/0172230 A1* | 6/2019 | Mailhe .................... G06N 3/08 |

\* cited by examiner

GENERALIZED MULTI-CHANNEL MRI RECONSTRUCTION USING DEEP NEURAL NETWORKS

CROSS-REFERENCE TO RELATED APPLICATIONS

This application claims priority from U.S. Provisional Patent Application 62/623,973 filed Jan. 30, 2018, which is incorporated herein by reference.

STATEMENT REGARDING FEDERALLY SPONSORED RESEARCH OR DEVELOPMENT

This invention was made with Government support under contracts EB019241 and EB009690 awarded by the National Institutes of Health. The Government has certain rights in the invention.

FIELD OF THE INVENTION

The present invention relates generally to techniques for diagnostic imaging. More specifically, it relates to methods for magnetic resonance imaging using multiple receiver coils.

BACKGROUND OF THE INVENTION

Multi-channel imaging in MRI has been extremely successful in enabling the ability to reconstruct high quality images despite subsampling. However, the use of parallel imaging algorithms for reconstruction are confined by the need to acquire an extra calibration scan. Alternatively, the efficiency of data sampling is compromised to properly acquire sufficient data for calibration. This calibration procedure is prone to error, and is time consuming to perform for pseudo-random sampling schemes that are ideal for advanced reconstruction methods.

High-density receiver coil arrays are highly advantageous for magnetic resonance imaging (MRI). These hardware setups increase signal-to-noise-ratio by reducing the body noise. Additionally, the localized sensitivity profile of each array element can be exploited in the image reconstruction. The additional information from different sensitivity profiles enables image recovery despite subsampling the data acquisition. This feature allows for a reduction factor of 2 to 8 in scan durations. The scan time acceleration reduces the amount of patient motion, increases the temporal and/or spatial resolution for dynamic imaging, and overall improves patient experience.

The image reconstruction algorithms that enable this scan time reduction using the coil sensitivity information are collectively known as "parallel imaging," and they can be applied in either the frequency domain or the image domain. Popular frequency domain (i.e., k-space) parallel imaging algorithms include GRAPPA and SPIRIT. Popular image-based algorithms include SENSE and ESPIRiT. These standard techniques rely on calibration data (i.e., fully sampled low-resolution image) that characterizes the localized sensitivity profiles to guide the image reconstruction. This procedure is followed by a k-space interpolation step that leverages the calibration information to recover missing k-space samples. The calibration data can be obtained from a low-resolution image. However, to collect the calibration data, an additional MRI sequence must be used as a calibration scan. Alternatively, the data sampling must be fully sampled in the center of the k-m space for an auto-calibrated approach. The calibration scan prolongs the overall MRI exam time and is prone to error from mis-registration caused by patient motion between the calibration and imaging scans.

Auto-calibrated approaches (i.e., where acquisition of a low resolution image is part of the current scan) address these issues but impose a constraint on the k-space sampling. For high undersampling factors (>4), most of the data acquisition is spent on acquiring the auto-calibration region; this limitation decreases the sampling of high-spatial frequencies and compromises the ability to recover high spatial resolution information. Moreover, the computation time needed to estimate the information from the sensitivity maps can exceed the actual time for applying the information. A number of calibration-less algorithms (i.e., where no fully sampled low resolution data is available) have been recently proposed that address a few of these issues. Many of these methods rely on a lower dimensional subspace in the k-space samples to recover the missing data samples. These methods rely heavily on iterative algorithms, are time consuming to perform, and have challenges of ensuring convergence with good quality resulting images. These types of algorithms are much longer than standard parallel imaging algorithms.

BRIEF SUMMARY OF THE INVENTION

In one aspect, the invention provides an MRI technique based on deep convolutional neural networks, trained on a large dataset of historical data, which is generalized to a wide range of data acquisition models and sampling trajectories. The parallel imaging problem is addressed using deep convolution neural networks. The technique uses a trained neural network that can 1) model sensitivity maps for different hardware configurations, and 2) apply an appropriate model for estimating the missing k-space samples on a case-by-case basis. Since all the training and modelling are performed offline, this deep neural network solution is extremely fast when integrated into the clinical workflow. This approach eliminates the need for collecting calibration data during a scan and for estimating the calibration information.

Embodiments of the invention use deep learning for the reconstruction of multi-channel MRI. Historical data are exploited to model specific properties of multi-channel MRI to reconstruct the subsampled acquisition. It also uses components to generalize the approach to different hardware configurations and to enhance the training speed and accuracy.

In one aspect, the invention provides a method for magnetic resonance imaging using a magnetic resonance imaging apparatus, the method comprising: a) acquiring multi-channel subsampled k-space data using multiple receiver coils; b) performing singular-value-decomposition on the multi-channel subsampled k-space data to produce compressed multi-channel k-space data which normalizes the multi-channel subsampled k-space data; c) applying a first center block of the compressed multi-channel k-space data as input to a first convolutional neural network to produce a first estimated k-space center block that includes estimates of k-space data missing from the first center block; d) generating an n-th estimated k-space block by repeating for each n from 2 to N>2, applying an (n−1)-th estimated k-space center block combined with an n-th center block of the compressed multi-channel k-space data as input to an n-th convolutional neural network to produce an n-th estimated k-space center block that includes estimates of k-space data missing from the n-th center block, wherein the (n−1)-th estimated k-space center block is smaller in size than the n-th center block; and e) reconstructing image-space data from the N-th estimated k-space block.

Generating an n-th estimated k-space block preferably comprises, for each n from 2 to N>2, inserting into the produced n-th estimated k-space center block original data from the (n−1)-th estimated k-space center block combined with the n-th center block of the compressed multi-channel k-space data used as input.

The n-th convolutional neural network is preferably a residual network trained using center blocks extracted from fully sampled k-space datasets retrospectively subsampled with a fixed number of sampling masks.

The multi-channel subsampled k-space data may include different time frames or echoes stacked along with channels. The k-space data may be measured using a non-Cartesian trajectory and the data is first gridded onto a Cartesian grid. The multi-channel subsampled k-space data may be in three-dimensional space or more.

DETAILED DESCRIPTION OF THE INVENTION

The calibration-less parallel imaging problem is essentially a blind k-space interpolation problem. Deep convolutional neural networks (ConvNets) have been recently demonstrated to successfully recover missing image pixels for image inpainting in the image domain. Our solution differs from previous work in that ConvNets are typically applied in the image domain using different colors as different channels for natural color images. ConvNets have been adapted for MR image reconstruction, but these developments have been focused on applying these same type of networks in the image domain. Here, we introduce the infrastructure to apply these ConvNets in the k-space domain to focus on the known properties in that domain. This non-trivial adaptation to k-space involves solving new problems using innovative techniques.

For faster training and for broader applicability to different hardware setups with varying channel count and coil sizes, we perform an initial coil compression algorithm to normalize the data. Lastly, to address the highly non-uniform distribution of signal in k-space and the different correlation properties for different k-space regions, each k-space region is separately trained and applied.

Figure 1:
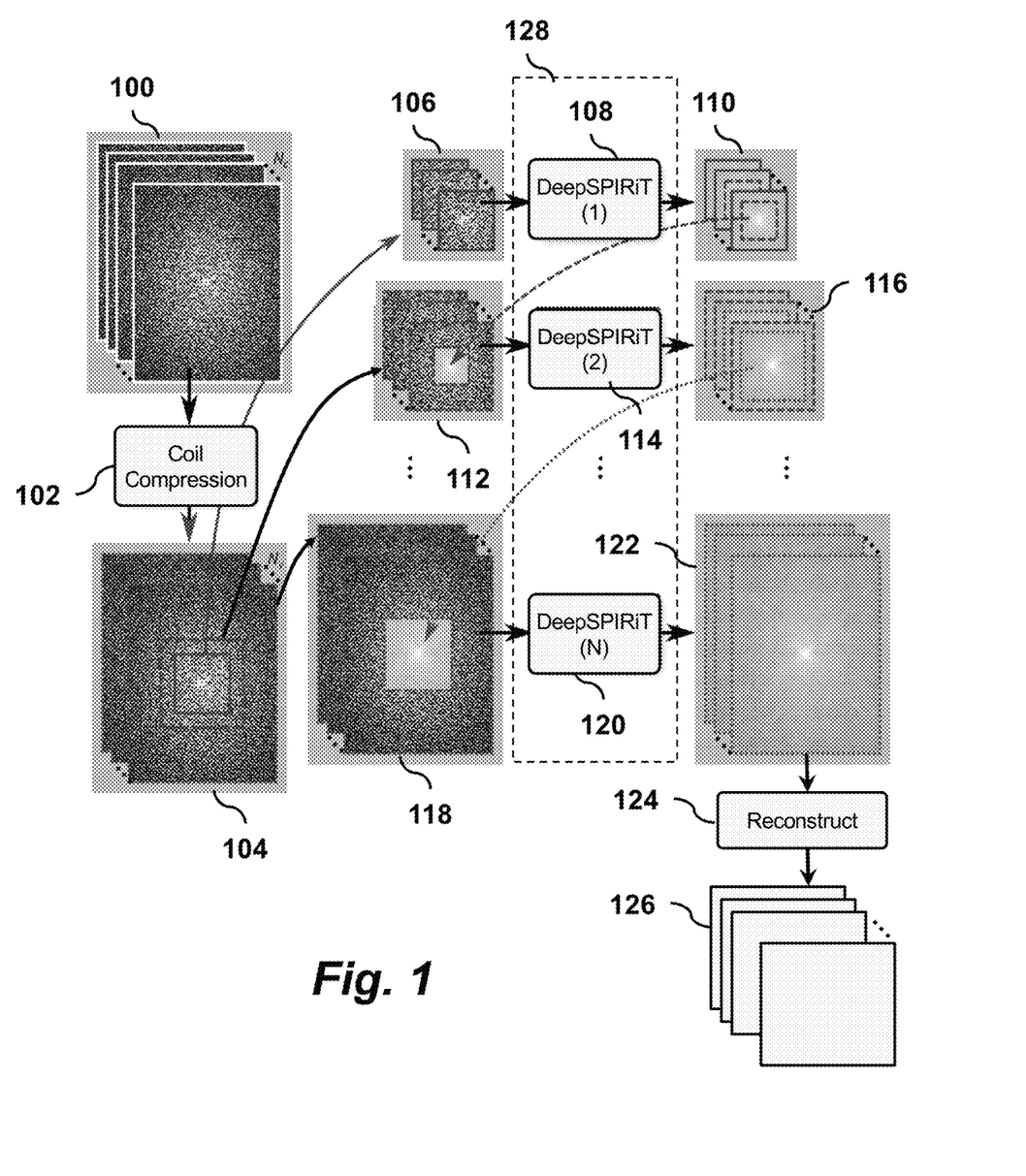
FIG. 1 is a schematic illustration of the processing pipeline implementing a method of MRI imaging, according to an embodiment of the invention.

An overview of the processing pipeline is illustrated in FIG. 1. It begins with multi-channel subsampled k-space data 100 acquired using multiple receiver coils of an MRI scanner. Before processing with the deep convolutional neural networks, the data is prepared in a preprocessing step 102, which is motivated by the following considerations. A wide range of different coil arrays are used for MRI to cater to various patient sizes and anatomies. Given a sufficiently complex ConvNet model and a sufficiently large number of samples for each type of hardware configuration, these different setups can be learned and characterized by a single network. However, collecting enough data samples for each situation can be challenging. Therefore, to normalize all the different and ever-evolving hardware configurations, we use a singular-value-decomposition-based coil compression as a pre-processing step.

More specifically, for complex k-space data 100 organized as matrix X consisting of k-space samples in the first dimension and $N_c$ channels in the second, we first perform a singular-value-decomposition $X=USV^H$. Matrices U and V are unitary matrices, while matrix $V^H$ is the conjugate transpose of V, and matrix S is a diagonal matrix with singular values of matrix X as diagonal elements. The coil compression matrix is formed by selecting the $N_v$ dominant basis in V as $V_c$. The measurement at each k-space location for all coil channels can be formed into a one-dimensional vector. Each one-dimensional vector is then multiplied by $V_c$ to compress and rotate the data such that the data is ordered from the most significant singular value to the least one, namely $X_c = XV_c \approx US$. The result $X_c$ is the pre-processed data 104, which is then passed into the ConvNet for parallel imaging reconstruction.

As an optional step, between steps 122 and 124, the data after the ConvNet inference can be rotated back to the original data space, namely $YV_c^H$. This step is possible because the ConvNet is designed to maintain the original number of channels that was used as the initial input to the ConvNet 128.

The purpose of the ConvNet 128 is to estimate missing samples in the k-space data due to undersampling. Each missing sample in the k-space domain is estimated from neighboring k-space samples and from different channels. This concept leads to the application of ConvNet in the k-space domain. Since this network generalizes the SPIRIT (iterative self-consistent parallel imaging reconstruction) k-space interpolation kernel, we refer to this approach as "DeepSPIRIT".

For constructing and training a general ConvNet for parallel imaging, we consider the data characteristics in the k-space domain. The energy in the k-space domain is highly non-uniform with a significant amount of energy concentrated at the center of k-space. This property renders the training difficult since learning becomes biased toward reconstructing the k-space center, and thus, the learned network will perform poorly away from the k-space center. Furthermore, different frequency bands have distinct data properties that can be exploited to tune a more optimal interpolation function for estimating the missing data samples. Thus, we propose to segment k-space into frequency bands with the segmentation determined by the distance from the k-space center. The segmentation takes the form of center blocks of different sizes in k-space, as illustrated in 104.

In 106, the smallest multi-channel k-space center block is first extracted from k-space data 104 and passed into a convolution neural network, DeepSPIRiT(1) 108. The output 110 is a set of data where the known samples are kept, and the missing samples are estimated in the DeepSPIRiT(1) network. The input to network 108 consists of measured k-space data with many of the measurements missing. In the final stage of the network in 108, the known measured k-space data from the input are inserted into the output from the final convolutional layers. In other words, data $X_c$ has a number of missing measurements. M can be defined as the mask of what is actually measured. The final output is $$Y=\text{DeepSPIRiT}(1)(X_c)*(1-M)+M*X_c,$$

where * is a point wise multiplication.

In 112, a smaller centered subblock of the output 110 is combined with the original data 104 to produce a slightly larger block of k-space 112, which is passed through a second network, DeepSPIRiT(2) 114 to produce output 116. Again, a smaller centered subblock of the output 116 is combined with the original data 104 to produce a slightly larger block of k-space, which is passed through the next network. This is repeated N times until, in the last step, a smaller centered subblock of the output from the prior step is combined with the original data 104 to produce a full sized block of k-space 118, which is passed through the last network 120 to produce the entire k-space data 122, which includes estimates of the missing samples in the entire k-space data 104.

To ensure that the final k-space data 122 complies with the originally measured k-space samples 104, the ConvNet outputs the same number of channels that is inputted into the network. In this way, the original k-space measurements can be directly inserted into the corresponding k-space locations in the final output of the inference stage.

To recap, the entire sub-sampled k-space 104 is processed in a sequential manner. First, we start with a center block of k-space 106, and insert this subsampled data block into a DeepSPIRiT network 108 specifically trained to estimate missing samples in the center k-space location. To avoid edge effects from the convolution layers, the estimated k-space samples at the edges are discarded.

The center of the output 110 from the first network 108 and a larger data block of the original sub-sampled k-space are then combined to form input 112 which is then passed through the second DeepSPIRIT network 114. Again, the known measurements are inserted into the output of this second network and the estimated k-space samples at the edges are discarded. This process is repeated N times with successively larger blocks of k-space until the entire k-space 122 is reconstructed. This final output can be sent to the image reconstruction stage 124 in a conventional MRI reconstruction pipeline as if the data 122 was acquired from a fully sampled scan.

At this point, conventional image reconstruction 124 can be performed with the newly estimated calibration data (a fully sampled low-resolution image), and these conventional approaches have been heavily optimized in terms of performance if the calibration information is readily available.

The final reconstructed image 126 will still leverage the actual measurements made and will minimize the chance of hallucinating anatomical structures. Moreover, the final images can be tuned to tradeoff between residual aliasing artifacts and the dependency on the information generated by the ConvNet. Note, replacing known measurements in each DeepSPIRiT step does not need to be performed during training of the ConvNet.

Figure 2:
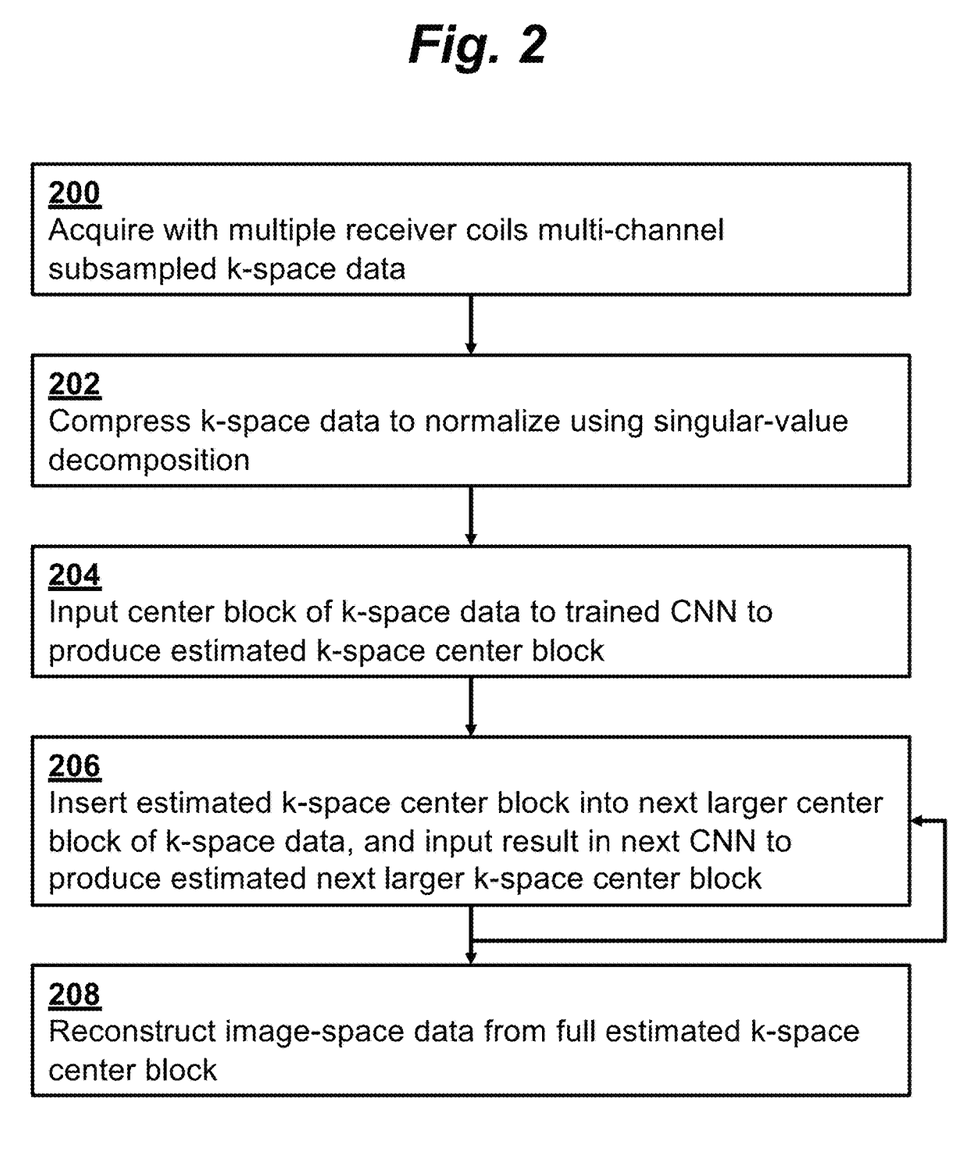
FIG. 2 is flowchart providing an overview of a method of MRI imaging, according to an embodiment of the invention.

FIG. 2 is flowchart providing an overview of a method of MRI imaging, according to an embodiment of the invention. In step 200, multi-channel subsampled k-space data is acquired using multiple receiver coils of an MRI apparatus. In step 202, singular-value-decomposition on the multi-channel subsampled k-space data is performed to produce compressed multi-channel k-space data which normalizes the multi-channel subsampled k-space data. In step 204, a first center block of the compressed multi-channel k-space data is applied as input to a first convolutional neural network to produce a first estimated k-space center block that includes estimates of k-space data missing from the first center block. In step 206, an n-th estimated k-space block is generated by repeating for each n from 2 to N>2, applying an (n−1)-th estimated k-space center block (which is smaller in size than the n-th center block) combined with an n-th center block of the compressed multi-channel k-space data as input to an n-th convolutional neural network to produce an n-th estimated k-space center block that includes estimates of k-space data missing from the n-th center block. In step 208, image-space data is reconstructed from the N-th estimated k-space block.

Network Architecture

Figures 3A, 3B:
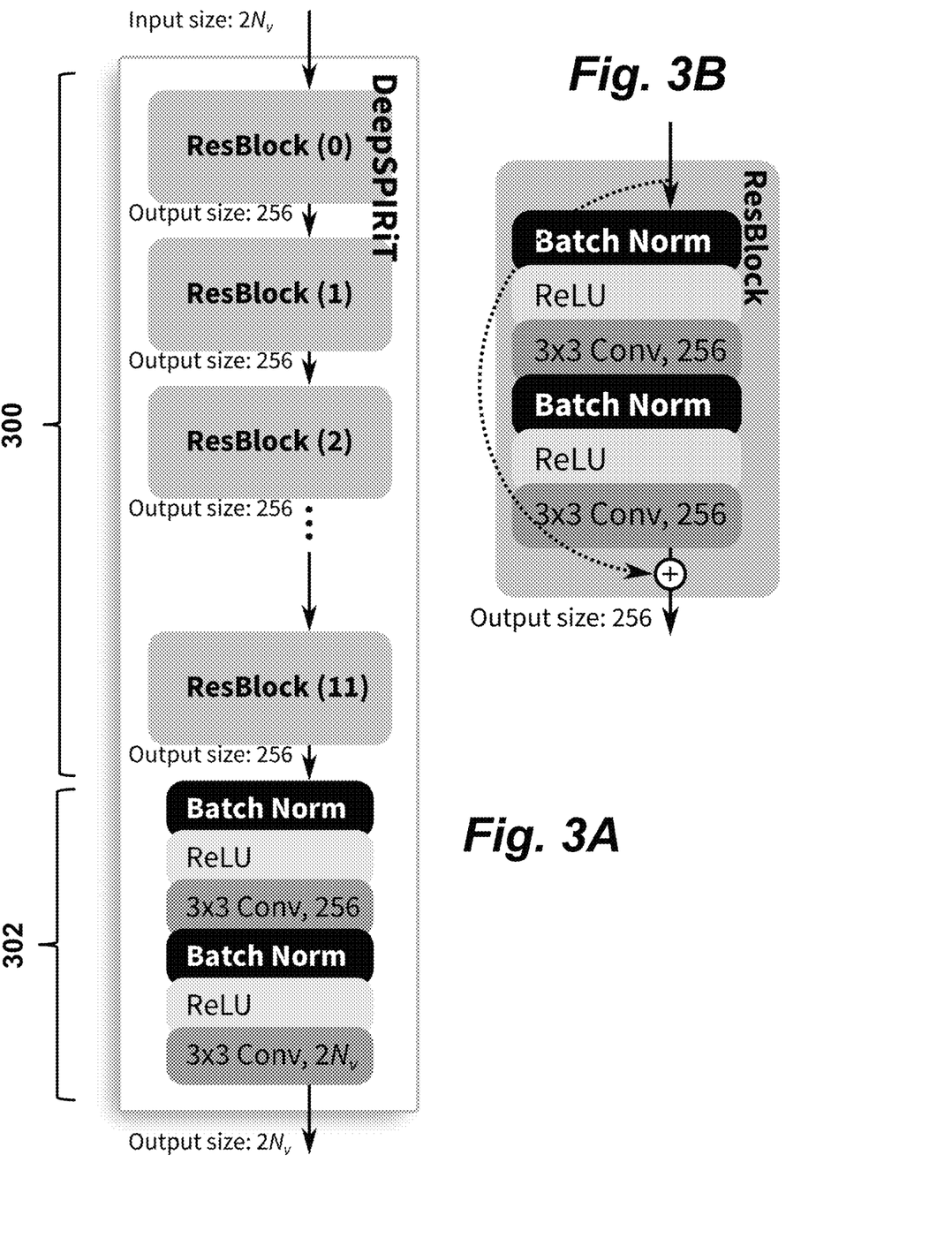
FIGS. 3A-B provide a schematic illustration of a convolutional neural network architecture used to process undersampled k-space data, according to an embodiment of the invention.

FIGS. 3A-B provide a schematic illustration of a convolutional neural network architecture used to process undersampled k-space data blocks according to an embodiment of the invention. The network takes as input the initial raw data after it has been compressed from an arbitrary number of channels of measurement data to $N_v$ channels. The real and imaginary components of the complex data are then divided into two separate channels for a total of $2N_v$ channels that are inputted into the DeepSPIRiT network. Each DeepSPIRiT CNN (FIG. 3A) is built from 12 residual blocks 300 followed by block 302 which will be described in more detail below. FIG. 3B details the structure of each of the residual blocks 300. When needed, 1×1 convolution is used in the skip connection to change the number of feature channels, as shown by the dotted line.

In one implementation, the DeepSPIRiT network (FIG. 3A) is a standard residual network having a sequence of 12 residual blocks 300, each with 256 feature maps. The residual connection in the first residual block is expanded to 256 feature maps using 1×1×$2N_v$×256 convolution kernels. Each residual block (FIG. 3B) contains two convolutional layers with 3×3×256×256 convolution kernels followed by batch normalization and a nonlinear activation function modeled with a rectified linear unit (ReLU). After the residual blocks, the data are then passed through another block 302 which includes a 3×3× 256×256 convolution layer, batch normalization, ReLU activation, and a final layer that is 1×1×256×$2N_v$ convolution layer to project the data back to the original number of channels. No activation function is used after this layer to allow the network to output both positive and negative values.

In a preferred embodiment, the k-space is segmented into four regions (N=4). The first region is a 40×40 block of data in the k-space center. The center 24×24 of the output is kept and passed along with 80×80 block of data. The center 60×60 of the output of the second network is kept and passed along with 160×160 block of data. The center 140×140 of the output of the third network is kept and passed to the final network with the rest of the k-space data.

Network Training

To train the DeepSPIRiT networks, fully sampled datasets were retrospectively subsampled with a fixed number of different sampling masks. For each training example, a sampling mask was randomly chosen. During the training of the center block of k-space, DeepSPIRIT(1), the subsampling factor of the masks ranged from 1.5 to 2. For the training of all other networks that will be applied in the outer portions of k-space, the subsampling factor R of the sampling masks ranged from 2 to 9. Both uniform subsampling (every R lines were kept) and uniformly pseudo-random (generated using poisson disk sampling) were used during training.

The deep networks were trained using an $l_2$-loss of the missing samples. The available samples will eventually be replaced with the actual measurements, so we enable the ability for the network to modify those samples if needed. Adam optimizer with a beta of 0.9 and a learning start rate of 1e–4 was used for training. With a batch size of 32 samples, each network was trained for 1 day. In the training of the ConvNets that are applied to the outer portions of k-space, the assumption is that the center regions have already been accurately reconstructed. Therefore, to parallelize the training of each network, the ground truth data are inserted into the center regions when training the outer regions.

Fully sampled 8-channel volumetric knee datasets of 19 patients were used. For this case, the coil compression step did not reduce the number of channels, but normalized the data to be properly aligned. Axial slices were extracted from each dataset and treated as separate examples. For training, datasets of 14 different patients were used with a total of 4480 axial slices. Datasets of two patients with a total of 640 axial slices were used for validation. Datasets of three patients with a total of 960 axial slices were used for testing. To demonstrate the generality of the resulting network, the trained models are applied to datasets that were subsampled using a variable-density pseudo-random sampling.

Experiments

For comparison, state-of-the-art parallel imaging algorithm, ESPIRiT, was also performed using the Berkeley Advanced Reconstruction Toolbox (BART). Since the datasets were subsampled in the calibration k-space region, conventional ESPIRIT cannot accurately estimate sensitivity maps. Therefore, we assume that accurate sensitivity maps can still be estimated by computing ESPIRiT sensitivity maps based on the fully-sampled ground truth data. In practice, this information is unavailable, and the sensitivity maps must be computed using either a separate acquisition or through a calibration-less technique.

Figure 4:
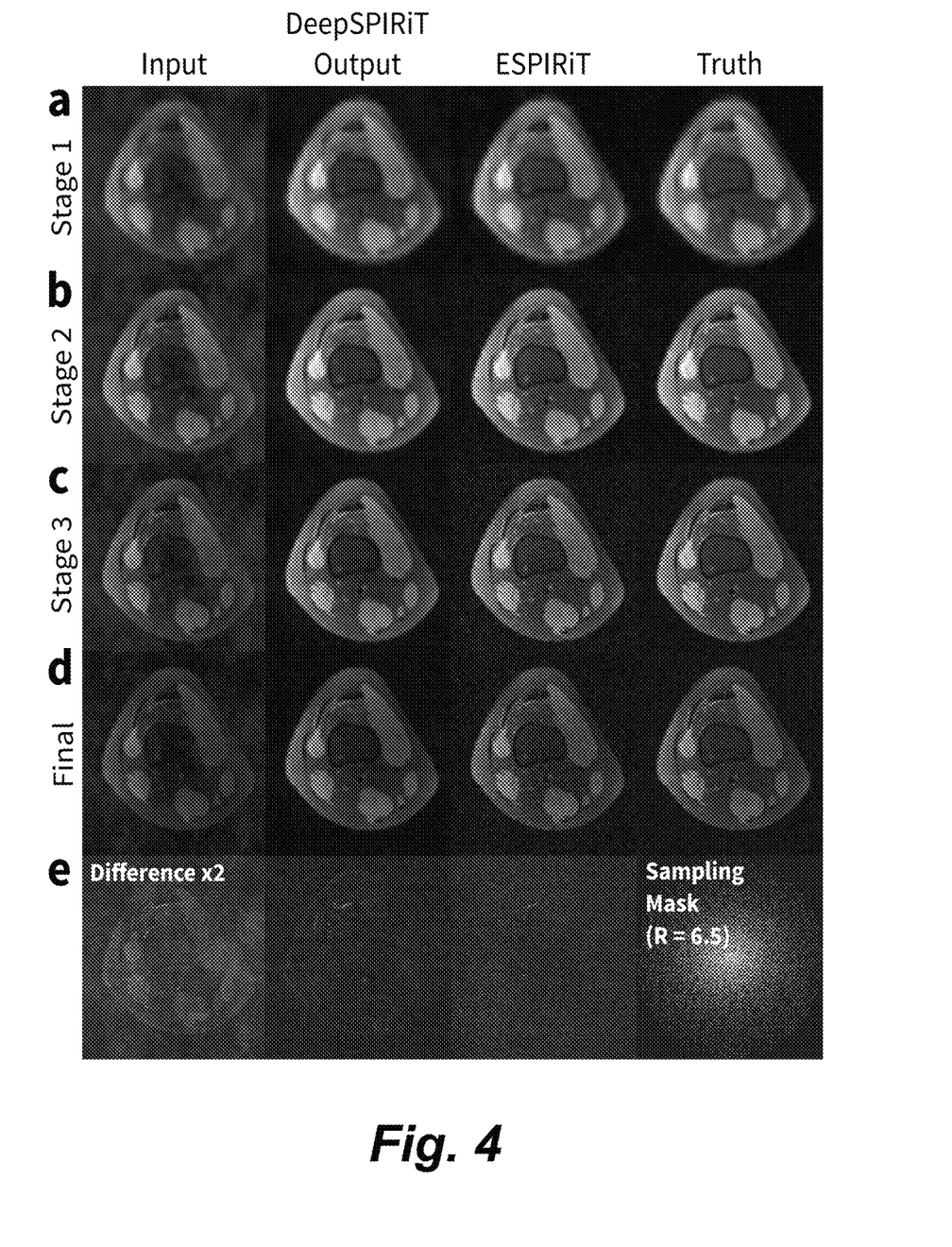
FIG. 4 is an image grid illustrating multi-stage image reconstruction in four stages comparing input, DeepSPIRiT, ESPIRiT, and ground truth images, performed on an MRI scan of the knee.
Figure 5:
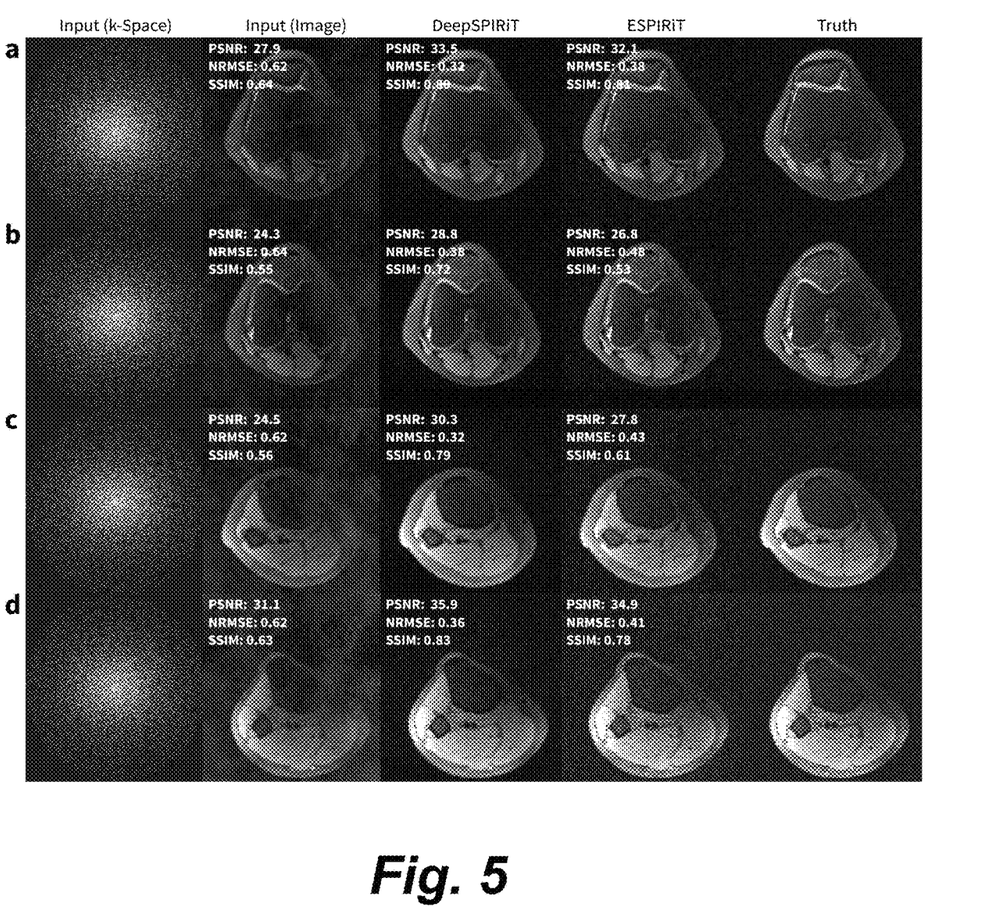
FIG. 5 is an image grid illustrating results for a subsampling factor of 6.5 comparing input, DeepSPIRiT, ESPIRiT, and ground truth images, where the first two rows depict axial slices from subject 1 and the second two rows from subject 2.

The output of each stage for a single axial slice is shown in FIG. 4. The final results for a random selection of axial slices are also depicted in FIG. 5. These show that Deep-SPIRIT network outperforms ESPIRiT in terms of peak-signal-to-noise-ratio (PSNR), normalized root-mean-squared-error (NRMSE) that is normalized by the $l_2$-norm of the ground truth, and structural similarity index (SSIM).

FIG. 4 is an image grid showing results of multi-stage image reconstruction performed on an MRI scan of the knee, comparing input, DeepSPIRiT, ESPIRiT, and ground truth (fully sampled) images in the four columns. The reconstruction of the 8-channel k-space data was performed in 4 stages, shown in rows a, b, c, d. The original k-space data was first subsampled by a factor of 6.5. The sampling mask is shown in the right of column e. In stage 1, a 40×40 block of k-space is first reconstructed using a DeepSPIRiT network trained for the low-resolution image. The result is then passed to the second stage with 80×80 block of k-space. In the third stage, the result of the second stage is reconstructed using a 160×160 block of k-space. The fourth and final stage image takes the results of the previous stages and reconstructs the full 256×320 of data. For comparison, the state-of-the-art ESPIRiT algorithm is shown in the third column, and the fully sampled ground truth is shown in the last column. Though the network is trained on uniformly subsampled datasets, the network can be applied to variable-density subsampled acquisitions.

FIG. 5 is an image grid showing results for a subsampling factor of 6.5 where the first and second rows depict axial slices from subject 1 and the third and fourth rows from subject 2. Fully-sampled volumetric knee datasets with 8-channels were used for testing. Since the datasets were acquired using a Cartesian acquisition, the acquisition is retrospectively subsampled in two dimensions in the axial directions. The subsampled k-space data and the resulting image are shown in the first two columns. The result from DeepSPIRiT is shown in the third column. State-of-the-art parallel imaging algorithm using ESPIRiT is shown in the fourth column. The ground truth is shown in the last column. The performance of ESPIRiT is dependent on the accuracy of the sensitivity maps, and thus, the sensitivity maps used in ESPIRiT were computed based on the ground truth. Despite enabling ESPIRiT to leverage information from the ground truth, our proposed technique reconstructed the multi-channel images with higher peak-to-signal-noise-ratio (PSNR), lower normalized root mean square error (NRMSE), and higher structural similarity index (SSIM).

Applications

The techniques of the present invention are applicable to subsample prospectively or retrospectively any MR acquisition for reducing scan durations or to increase spatiotemporal resolutions. It can also be used in conjunction with any MR sampling trajectory. The techniques are useful to reduce the total MRI exam duration, which is especially useful to reduce the duration of anesthesia required for imaging uncooperative patients.

The techniques of the present invention eliminate the need for time- and data-intensive calibration of sensitivity profiles. In effect, the reconstruction from the raw k-space data is achieved using a single forward pass through a deep network trained with historical patient data. This approach has several advantages:

It eliminates the need for calibration scan which typically prolongs the exam, and potentially introduces artifacts from miss-calibration or from patient motion between the calibration and the actual scan.

It eliminates the need for acquiring an auto-calibration region. Acquiring an auto-calibration region as part of the data acquisition either increases the scan duration, or increases the subsampling factor at higher spatial frequencies. Direct acquisition of auto-calibration region may also exacerbate artifacts such as in echo-planar imaging.

The reconstruction time is reduced by eliminating the need to estimate scan specific parameters for parallel imaging.

Without this technique, for pseudo-randomly subsampled acquisitions, an iterative parallel imaging algorithm is required. Alternatively, a specific interpolation kernel can be computed for each localized sampling pattern, which can be expensive in memory and time to compute. The techniques eliminate the need for both the iterative algorithm and the need to compute data specific kernels for each subsampling pattern.

Adopting coil compression for normalization generalizes the training and network architecture to various coil hardware configurations.

The k-space segmentation technique speeds up the training and enables the use of smaller models. For a given training duration, this approach enhances the modeling power, and better accommodates changes in the model upon arriving new data or for new hardware setups.

Using the same number of output and input channels for the network, one can easily ensure data fidelity for the reconstructed images. This property reduces the chance of hallucinating structures or features that will be detrimental for clinical diagnosis.

Variations or Modifications

To better leverage the data, k-space conjugate symmetry can be included by adding the complex conjugate k-space data as additional input. At the input, the k-space and its mirrored complex conjugate are concatenated. The k-space data associated with k-space coordinates $k_x$ and $k_y$ for coil c can be represented as $X_c(k_x, k_y, c)$. The mirrored complex conjugate corresponds to $X_m(k_x, k_y, c)=X_c^*(-k_x,-k_y,c)$. The number of channels outputted are kept the same in this modification.

The invention can be extended to perform the k-space interpolation in multi-dimensional space (3+ dimensions). For instance, different time frames or echoes can be stacked along with the channels. The convolutional layers can be extended to multi-dimensional space. Alternatively, the higher dimensions can be treated as additional input channels, and the number of feature maps for each convolutional layer will be increased to support these additional channels. In all cases, the final convolutional layer will output the same number of channels as inputted.

The network can be extended to the k-t space: the network can be trained to perform k-space interpolation with information from other time frames as additional channels. In this extension, the convolutional layers will consist of multi-dimensional convolutional kernels. The kernels will be of dimensions $W \times H \times T \times N_{input} \times N_{output}$ where W is the width, H is the height, T is the number of time points, $N_{input}$ is the number of input channels and $N_{output}$ is the number of output channels. The number of features maps can be maintained.

The invention can be extended to perform parallel imaging for arbitrary trajectories, including spiral sampling, radial sampling, and cones. For example, the non-Cartesian data can be first gridded onto a Cartesian grid. Afterward, the same exact network setup can be applied.

The output of the network can be used as an initialization for conventional parallel imaging and/or compressed sensing approaches.

The network can be inserted as a block in an iterative reconstruction algorithm, such as for compressed-sensing.

The network can be joined with an image-based convolutional neural network to leverage properties in both the frequency and spatial domains.

The network can be used to construct only the subsampled calibration region. The output from the network can then be used in any conventional auto-calibrated parallel imaging algorithm where the k-space interpolation is estimated from the calibration region.

The setup can be used to identify and subsequently eliminate overly corrupted k-space samples by comparing the output of the network with the acquired data samples.

In our description, a hard data projection is used to ensure that the measured data samples are used. This procedure can be altered with a soft-data projection that trade-offs between the data generated by the network and the measured samples. In this way, measurement noise can be suppressed. The impact form corrupted data samples can also be suppressed. For example, the reconstructed data can be a linear combination of the input data and the output data where the weights are computed based on the degree of motion corruption. The amount of motion corruption can be measured using external monitoring device (respiratory bellows, EKG signal, optical cameras, etc) or from MR-based motion navigators.

The invention claimed is:

1. A method for magnetic resonance imaging using a magnetic resonance imaging apparatus, the method comprising
    acquiring multi-channel subsampled k-space data using multiple receiver coils;
    performing singular-value-decomposition on the multi-channel subsampled k-space data to produce compressed multi-channel k-space data which normalizes the multi-channel subsampled k-space data;
    applying a first center block of the compressed multi-channel k-space data as input to a first convolutional neural network to produce a first estimated k-space center block that includes estimates of k-space data missing from the first center block;
    generating an n-th estimated k-space block by repeating for each n from 2 to N>2, applying an (n−1)-th estimated k-space center block combined with an n-th center block of the compressed multi-channel k-space data as input to an n-th convolutional neural network to produce an n-th estimated k-space center block that includes estimates of k-space data missing from an n-th center block, wherein the (n−1)-th estimated k-space center block is smaller in size than the n-th center block;
    reconstructing image-space data from the n-th estimated k-space block.

2. The method of claim 1 wherein generating an n-th estimated k-space block comprises, for each n from 2 to N>2, inserting into the produced n-th estimated k-space center block original data from the (n−1)-th estimated k-space center block combined with the n-th center block of the compressed multi-channel k-space data used as input.

3. The method of claim 1 wherein the n-th convolutional neural network is a residual network trained using center blocks extracted from fully sampled k-space datasets restrospectively subsampled with a fixed number of sampling masks.

4. The method of claim 1 wherein the multi-channel subsampled k-space data includes different time frames or echoes stacked along with channels.

5. The method of claim 1 wherein the k-space data are measured using a non-Cartesian trajectory and the data is first gridded onto a Cartesian grid.

6. The method of claim 1 wherein the multi-channel subsampled k-space data is in three-dimensional space.

* * * * *